United States Patent
Shin et al.

(10) Patent No.: US 7,027,339 B2
(45) Date of Patent: Apr. 11, 2006

(54) MEMORY DEVICE EMPLOYING OPEN BIT LINE ARCHITECTURE FOR PROVIDING IDENTICAL DATA TOPOLOGY ON REPAIRED MEMORY CELL BLOCK AND METHOD THEREOF

(75) Inventors: Dong-Hak Shin, Gyeonggi-do (KR); Ho-Sung Song, Seoul (KR); Byung-Sik Moon, Seoul (KR)

(73) Assignee: Samsung Electronics, Co., Ltd., Gyeonggi-so (KR)

( * ) Notice: Subject to any disclaimer, the term of this patent is extended or adjusted under 35 U.S.C. 154(b) by 0 days.

(21) Appl. No.: 11/197,227

(22) Filed: Aug. 4, 2005

(65) Prior Publication Data
US 2006/0028900 A1  Feb. 9, 2006

(30) Foreign Application Priority Data
Aug. 9, 2004  (KR) .................. 10-2004-0062279

(51) Int. Cl.
*G11C 7/00* (2006.01)
(52) U.S. Cl. ...................... 365/200; 365/190
(58) Field of Classification Search ............... 365/200, 365/190, 189.01
See application file for complete search history.

(56) References Cited

U.S. PATENT DOCUMENTS

| | | | | |
|---|---|---|---|---|
| 5,523,975 A | * | 6/1996 | Reddy | 365/200 |
| 5,835,425 A | * | 11/1998 | Berger | 365/200 |
| 6,571,352 B1 | | 5/2003 | Blodgett | |

FOREIGN PATENT DOCUMENTS

| | | |
|---|---|---|
| KR | 010093664 | 10/2001 |
| KR | 040008024 | 1/2004 |

* cited by examiner

*Primary Examiner*—Vu A. Le
(74) *Attorney, Agent, or Firm*—F. Chau & Associates, LLC

(57) ABSTRACT

A memory device has at least one pair of memory cell blocks, a spare row decoder, a data exchange control signal generator and a data exchange unit. When a defective memory cell in a first memory cell block is repaired with a spare memory cell in a second memory cell block that neighbors (or is adjacent) the first memory cell block, the data topology of the memory cell of the first memory cell may be matched to the memory cell of the second memory cell block.

13 Claims, 4 Drawing Sheets

MEMORY DEVICE EMPLOYING OPEN BIT LINE ARCHITECTURE FOR PROVIDING IDENTICAL DATA TOPOLOGY ON REPAIRED MEMORY CELL BLOCK AND METHOD THEREOF This application claims priority to Korean Patent Application No. 2004-62279 filed on Aug. 9, 2004 in the Korean Intellectual Property Office (KIPO), the entire contents of which are hereby incorporated by reference.

BACKGROUND OF THE INVENTION

1. Field of the Invention

The present invention relates to a memory device employing an open bit line architecture, and more particularly to a memory device for matching data topology in case of repairing a defective cell of a memory block, and a method thereof.

2. Description of Related Art

In a memory device, an open bit line cell structure is a configuration in which sense amplifiers are formed between bit line pairs (BL, /BL). Another configuration is a folded bit line cell structure in which the bit line pairs (BL, /BL) are formed side by side on one side of the sense amplifiers.

Memory cells having the open bit line architecture are arranged at all intersections where word lines WLs cross bit lines BLs. Such an arrangement can improve the density of the memory cells, thereby reducing an area occupied by the memory device. Compared to the folded bit line structure, the open bit line cell structure has a greater density and reduced cell area.

FIG. 1 is a block diagram illustrating a conventional memory device employing an open bit line architecture.

Bit line pairs (BL, /BL) are respectively placed at both sides of a sense amplifier block 130. Memory cell blocks 110 and 120 are placed at all intersections of the bit line pairs (BL, /BL) and word lines WLs.

The memory blocks 110 and 120 in the memory device include a normal memory cell block(s) and a spare memory cell block(s) for replacing a defective memory cell with redundant memory cell(s).

In addition, the memory device further includes row decoders 140 for decoding an external address to drive a normal word line in a corresponding memory cell block, spare row decoders 150 for storing information about defective addresses and driving a spare word line so as to repair a defective cell, and a column select switch CSW for providing data amplified by the sense amplifier 130 into local data line pairs (LDL, /LDL).

The memory cell blocks 110 and 120 illustrated in FIG. 1 may be identified using specified block address information. For example, when the eighth bit of an external row address provided from an external source is '0', an even numbered memory cell block 110 is selected. And when the eighth bit of the external row address is '1', an odd numbered memory cell block 120 is selected.

In general, a memory cell formed at an intersection of a bit lines BL and a word lines WL is defined as a 'true cell', and a memory cell formed at an intersection of a bit lines /BL and a word line WL is defined as a 'complement cell'.

The true cell stores data having a data topology identical to the data topology of data provided from an external source. The complement cell stores data having a reverse data topology of the data provided from the external source.

In the memory device employing an open bit line structure, data topology in the even numbered memory cell block 110 has a data sequence of C-T-C-T cells, whereas the data topology in the odd numbered memory cell block 120 has a data sequence of T-C-T-C cells. Hereinafter, the data topology is referred to as the order of data input/output or the data input sequence/data output sequence. Namely, the even numbered memory cell block has different data topology from the odd numbered memory cell block.

As a result, a defective cell in a first memory cell block may be replaced with a normal cell in the first memory cell block since the data topology is the same within the same memory cell block. However, a defective cell in a first memory cell block may not be replaced with a normal cell in a second memory cell block that neighbors the first memory cell block since the data topology is different without a user reprogramming a memory test pattern.

SUMMARY OF THE INVENTION

According to an embodiment of the present invention, a memory device employing open bit line architecture matches data topology between memory cell blocks during a repair operation.

According to an embodiment of the present invention, a memory device includes at least one pair of memory cell blocks adjacent to each other having an open bit line cell architecture, and having a normal cell array and a spare cell array. The memory device include a spare row decoder configured to generate a spare word line enabling signal in response to a defective row address, and configured to generate at least one comparison signal in response to the spare word line enabling signal and a memory cell block address of a first memory cell block among the at least one pair of memory cell blocks. The memory device further includes a data exchange control signal generator configured to generate a data exchange control signal in response to the at least one comparison signal, and a data exchange unit configured to selectively exchange a data line with an inverted data line to respectively couple the data line and the inverted data line to inverted read data and read data in response to the data exchange control signal, the data line and the inverted data line coupled to a second memory cell block adjacent to the first memory cell block.

According to an embodiment of the present invention, a memory device includes at least one pair of memory cell blocks adjacent to each other having an open bit line cell architecture, and having a normal cell array and a spare cell array, and a spare row decoder configured to generate a spare word line enabling signal in response to a defective row address, and configured to generate at least one comparison signal in response to the spare word line enabling signal and a memory cell block address of a first memory cell block among the at least one pair of memory cell blocks. The memory device further includes a data exchange control signal generator configured to generate a data exchange control signal in response to at least one comparison signal, a write driver configured to output write data and inverted write data, and a data exchange unit configured to selectively exchange the write data with the inverted write data to respectively couple the write data and the inverted write data to a data line and an inverted data line in response to the data exchange control signal, the data line and the inverted data line coupled to a second memory cell block adjacent to the first memory cell block.

According to an embodiment of the present invention, a method of performing a read operation in a memory device, the memory device including open bit line cells and having a first memory cell block and a second memory cell block adjacent to the first memory cell block, includes generating a spare word line enabling signal of the first memory cell block in response to at least one defective address of the second memory cell block, generating a data exchange control signal in response to the spare word line enabling signal and a memory cell block address signal of the second memory cell block, selectively exchanging first data of a data line with a second data of inverted data line in response to the data exchange control signal, the data line and the inverted data line coupled with the first memory cell block, and outputting the first data and the second data to an external pin.

According to an embodiment of the present invention, a method of performing a write operation in a memory device, the memory device including open bit line cells, and having a first memory cell block and a second memory cell block adjacent to the first memory cell block, includes generating a spare word line enabling signal of the first memory cell block in response to at least one defective address of the second memory cell block, generating a data exchange control signal in response to the spare word line enabling signal and a memory cell block address signal of the second memory cell block, outputting write data and inverted write data in response to a write control signal in a write driver, and selectively exchanging the write data and the inverted write data to an inverted data line and a data line in response to the data exchange control signal, the data line and the inverted data line coupled with the first memory cell block.

BRIEF DESCRIPTION OF THE DRAWINGS

The present invention will become more apparent by describing in detail example embodiments thereof with reference to the accompanying drawings, in which.

DETAILED DESCRIPTION OF PREFERRED EMBODIMENTS

Detailed illustrative embodiments of the present invention are disclosed herein. This invention may, however, be embodied in many alternate forms and should not be construed as limited to the embodiments set forth herein. Like numbers refer to like elements throughout the description of the figures.

Figure 1:
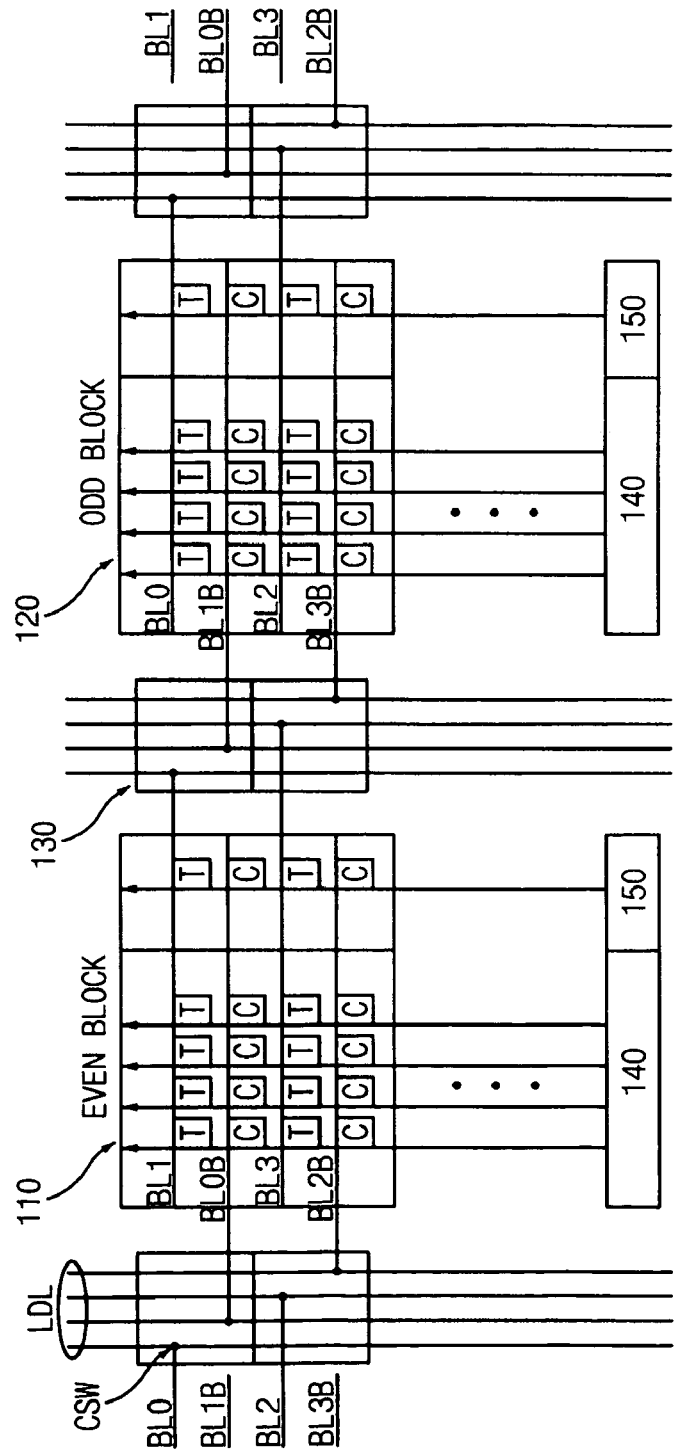
FIG. 1 is a block diagram illustrating a conventional memory device employing open bit line architecture.
Figure 2:
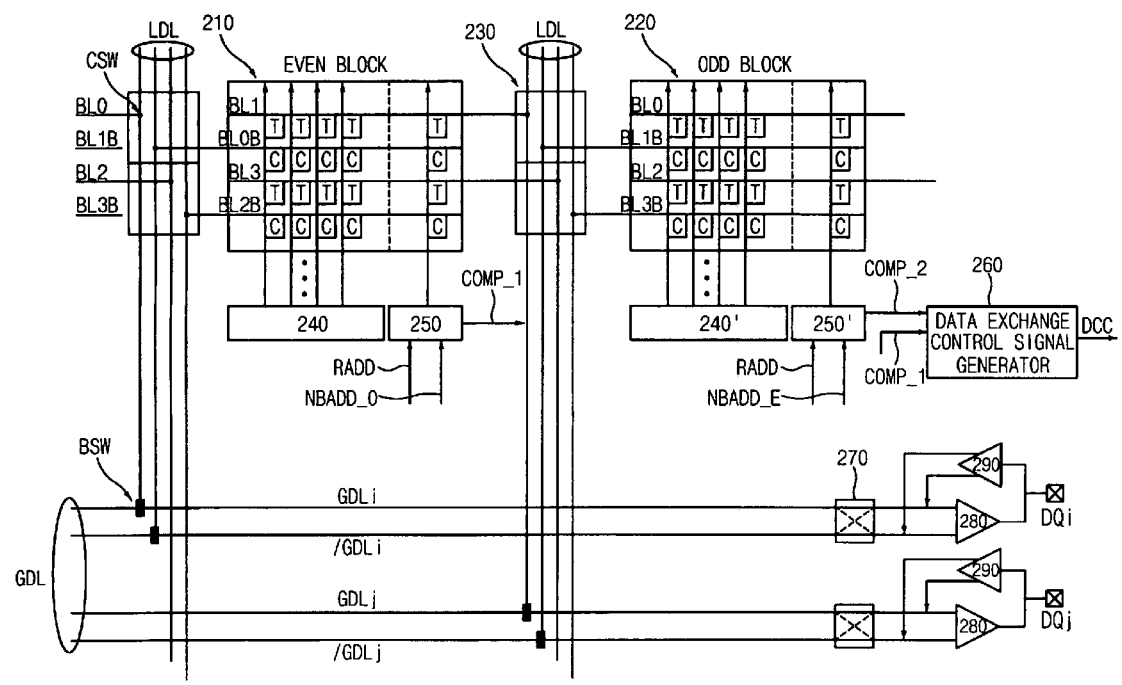
FIG. 2 is a block diagram illustrating a memory device employing open bit line architecture according to an example embodiment of the present invention.

FIG. 2 is a block diagram illustrating a semiconductor memory device employing open bit line architecture according to an embodiment of the present invention.

Referring to FIG. 2, the semiconductor memory device 200 includes an even numbered memory cell block 210, an odd numbered memory cell block 220, a sense amplifier block 230, normal row decoders 240 and 240', spare row decoders 250 and 250', local data line pairs LDL and /LDL (shown collectively as LDL), global data line pairs GDL and /GDL, a data exchange control signal generator 260, a data exchange unit 270, a main amplifier 280 and a write driver 290.

The memory cell blocks 210 and 220 are formed at intersections where word lines cross bit lines BL or /BL (shown as BLn and BLnB, respectively, where n is an integer), and include a normal memory cell block where a word line is enabled by the normal row decoders 240 and 240', and a spare memory cell block where a spare word line is enabled by the spare row decoders 250 and 250'.

The spare row decoders 250 and 250' generate comparison signals COMP_1 and COMP_2 in response to row address signals RADD provided from an external source and a neighboring memory cell block address signal NBADD.

The data exchange control signal generator 260 generates a data exchange control signal DCC in response to the comparison signals COMP_1 and COMP_2.

The sense amplifier block 230 may be coupled to one of the local data line pair LDL and /LDL under the control of a column select switch CSW. The local data line pair LDL and /LDL may be coupled to the global data line pair GDL and /GDL under the control of a block select switch BSW.

Figure 4:
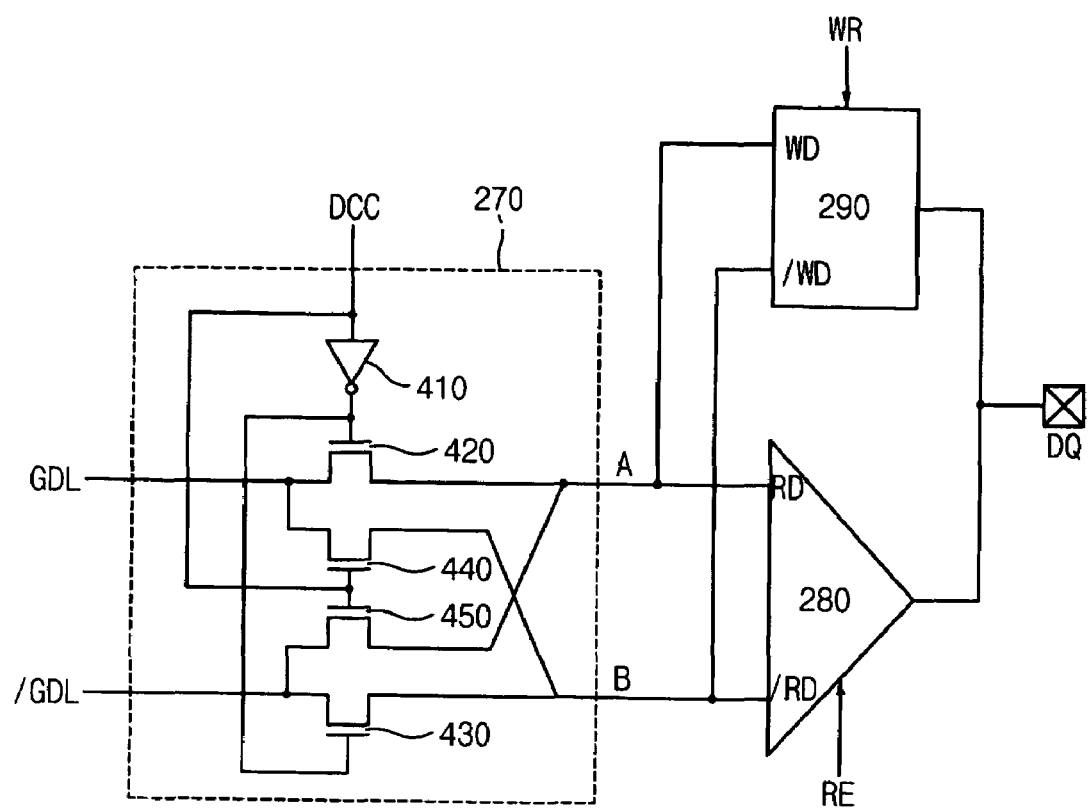
FIG. 4 is a block diagram illustrating a data exchange unit, a main amplifier and a write driver of FIG. 2.

During a read operation, the data exchange unit 270 selectively exchanges inputs of the global data line pair GDL and /GDL in response to the data exchange control signal DCC to couple one of the global data lines GDL and /GDL to one of the input pair RD and /RD of the main amplifier 280 (see for example, FIG. 4).

During a write operation, the data exchange unit 270 selectively exchanges an output pair WD and /WD of the write driver 290 to couple one of the output pair WD and /WD to one of the global data line pair GDL and /GDL.

Figure 3:
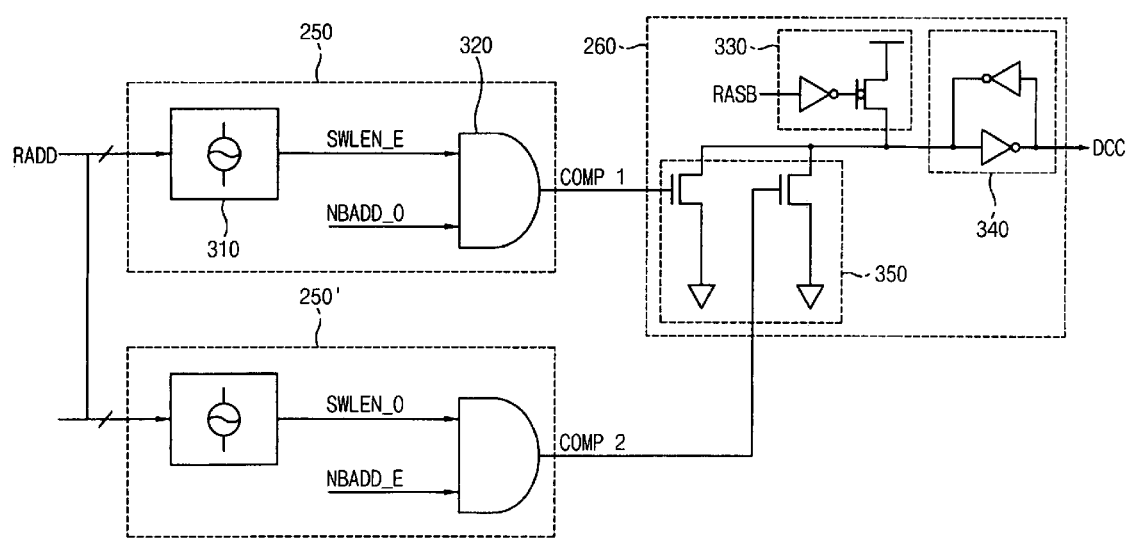
FIG. 3 is a circuit diagram illustrating spare row decoders and data exchange control signal generator shown in FIG. 2.

FIG. 3 is a circuit diagram illustrating the spare row decoders 250, 250' and the data exchange control signal generator 260 of FIG. 2.

The spare row decoder 250 of the even numbered memory cell block includes a defective address storing unit 310 (for example, a storage unit that stores defective addresses by cutting a fuse corresponding to a non-defective address) for storing defective addresses and a predetermined logic circuit.

An example of the logic circuit is an AND gate 320. When the addresses RADD are identical to the address(es) of defective memory cell(s) stored in the defective address storing unit 310, the defective address storing unit 310 generates a spare word line-enabling signal SWLEN_E.

The spare row decoder 250 performs a logical AND operation on the spare word line-enabling signal SWLEN_E and an odd numbered memory cell block address NBADD_O to generate the first comparison signal COMP_1.

Likewise, the spare row decoder 250' of the odd numbered memory cell block has configuration identical to the spare row decoder 250 of the even numbered memory cell block.

The spare row decoder 250' of the odd numbered memory cell block generates the second comparison signal COMP_2 in response to the addresses RADD provided from an external source and a neighboring even numbered memory cell block address NBADD_E.

The data exchange control signal generator 260 includes a pre-charge unit 330, a latch 340 and a discharge unit 350.

When the memory device 200 has a pre-charge state (the RASB is at a logic-high), the pre-charge unit 330 and the latch 340 precharge a data exchange control signal DCC to a logic-low state and maintain the data exchange control signal DCC at the logic-low state. When the memory device 200 has an active-state (the RASB is at logic-low), the discharge unit 350 enables the DCC to have a logic-high state in response to the comparison signals COMP_1 and COMP_2.

For example, assuming that the even numbered memory cell block 210 is selected when a block address has a logic-high state and the odd numbered memory cell block 220 is selected when a block address has a logic-high state, a case of replacing a defective cell of the odd numbered memory cell block 220 with a spare cell of the even numbered memory cell block 210 is now explained.

Row addresses corresponding to defective cells of the odd numbered memory cell block 220 are provided from an external source, and the addresses RADD that represent the other addresses except the block address among the provided addresses are stored into the defective address storing unit 310. When the addresses RADD provided from an external source are identical to the defective addresses stored in the defective address storing unit 310, the spare word line-enabling signal SWLEN_E has a logic-high state that is outputted to the AND gate 320.

The AND gate 320 performs a logical AND operation on the odd numbered memory cell block address NBADD_O having a logic-high state and the spare word line-enabling signal SWLEN_E having a logic-high state and outputs the comparison signal COMP_1 having a logic-high state to the discharge unit 350 of the data exchange control signal generator 260.

As a result, the data exchange control signal generator 260 outputs the data exchange control signal DCC having a logic-high state in response to the COMP_1 provided to the discharge unit 350 of the data exchange control signal generator 260.

Similarly, when a defective memory cell of the even numbered memory cell block 210 is replaced with a spare cell of the odd numbered memory cell block 220, a logical AND operation is performed on the even numbered memory cell block address NBADD_E having a logic-high state and the spare word line-enabling signal SWLEN_O having a logic-high state, and the comparison signal COMP_2 having a logic-high state is output to the discharge unit 350 of the data exchange control signal generator 260.

As a result, the data exchange control signal generator 260 outputs the data exchange control signal DCC having a logic-high state in response to the COMP_2 provided to the discharge unit 350 of the data exchange control signal generator 260.

FIG. 4 is a circuit diagram illustrating a data exchange unit 270, a main amplifier 280 and a write driver 290 shown in FIG. 2.

Referring to FIG. 4, the data exchange unit 270 includes an inverter 410 and four transistors 420, 430, 440 and 450. The inverter 410 inverts a state of the data exchange control signal DCC outputted from the data exchange control signal generator 260.

When the inverted DCC has a logic-high state, the transistor 420 and 430 of the data exchange unit 270 couple the GDL line to a node A, and couple /GDL line to a node B, respectively. Further, the transistor 440 and 450 of the data exchange unit 270 couple the GDL line to the node B, and couple the /GDL line to the node A, respectively.

The main amplifier 280 receives read data RD and the inverted read data /RD that are complements of each other in response to a read control signal RE. When the read data RD has a logic-high state and the inverted read data /RD has a logic-low state, the main amplifier 280 outputs data '1' to an external pin DQ.

The write driver 290 outputs write data WD and the inverted write data /WD that are complements of each other in response to a write control signal WR to the data exchange unit 270. When data provided from the external pin DQ is '1', the write driver 290 outputs the write data WD having a logic-high state and the inverted write data AND having a logic-low state.

A read operation and write operation on a semiconductor memory device according to an embodiment of the present invention are now explained with reference to the drawings described above.

The following assumes that a defective cell in the odd numbered memory cell block 220 is repaired by a spare cell in the even numbered memory cell block 210 neighboring the odd numbered memory cell block 220.

Further, assume that addresses corresponding to defective cells in the odd numbered memory cell block 220 are stored in the defective address storing unit 310 of the spare row decoder 250 of the even numbered memory cell block 210.

For a read operation, the DCC has a logic-low state by the pre-charge unit 330 since the RASB (/RAS, /Row Address Strobe) has a logic-high state before the memory device is activated. The RASB signal is an active signal that represents whether the memory device is activated or not.

When the active command, e.g., the RASB having a logic-low state, the pre-charge unit 330 doesn't perform a pre-charge operation and the latch 340 maintains the DCC at a logic-low state.

When the memory device is activated, defective addresses are inputted and the addresses RADD, which represent the addresses except the odd numbered memory cell block address NBADD_O among the inputted defective addresses, are inputted into the defective address storing unit 310.

When the inputted defective address is identical with a defective address stored in the defective address storing unit 310, a corresponding spare word line enabling signal SWLEN_E of the defective address storing unit 310 has a logic-high state.

The AND gate 320 of the spare row decoder 250 performs a logical AND operation on the spare word line enabling signal SWLEN_E and the odd numbered cell block address NBADD_O and generates the first comparison signal COMP_1 having a logic-high state.

The first comparison signal COMP_1 turns on the discharge unit 350 of the data exchange control signal generator 260 to enable the DCC to have a logic-high state.

When a read command RE is provided, data of a bit line pair BL and /BL, amplified by a sense amplifier, are respectively sent to a local data line pair LDL and /LDL under the control of a selected column select switch CSW, and the block select switch BSW transmits data of the local data line pair LDL and /LDL to each of the global data line pair GDL and /GDL.

As shown in FIG. 4, the transistors 440 and 450 of the data exchange unit 270 are turned on when the DCC has a logic-high state.

The transistor 440 couples the global data line GDL to the /RD of the main amplifier 280, and the transistor 430 couples the global data line bar /GDL to the RD of the main amplifier 280.

The main amplifier 280 amplifies a voltage difference or current difference between the RD and /RD to output data identical to the data RD to the external pin DQ. That is, data having a reverse topology of the selected spare cell data in an even numbered memory cell block are outputted to the external pin DQ.

Likewise, when a write command is provided, the data exchange unit 270 selectively couples the output pair WD and /WD of the write driver 290 to the global data line pair /GDL and GDL using the transistors 450 and 440 in response to the DCC.

That is, data having a reverse topology of the selected spare cell data in an even numbered memory cell block are outputted to the external pin DQ. Data having a reverse topology of the data provided from the external pin DQ is written into spare memory cells of an even numbered memory cell block.

When a defective memory cell of an even numbered memory cell block is repaired by a spare memory cell of an odd numbered memory cell block neighboring the even numbered memory cell block, the data topology of memory cells may be matched by reversing the data topology according to a matching process described herein.

In addition, embodiments of the present invention may be applied to matching data topology in case of repairing defective memory cells in two neighboring memory cell blocks.

While examples have been explained wherein a memory cell block has one spare word line, the present invention is not limited to a case where the memory cell block has one spare word line.

When a defective memory cell in a first memory cell block is repaired with a spare memory cell in a second memory cell block that neighbors (or is adjacent to) the first memory cell block, the data topology of the memory cell of the first memory cell may be matched to the memory cell of the second memory cell block, and a memory test time of repaired memory cells and complexity of a test program may be reduced.

While the embodiments of the present invention have been described in detail, it should be understood that various changes, substitutions and alterations may be made herein without departing from the scope of the invention.

What is claimed is:

1. A memory device comprising:
   at least one pair of memory cell blocks adjacent to each other having an open bit line cell architecture, and having a first cell array and a second cell array;
   a row decoder configured to generate a spare word line enabling signal in response to a defective row address, and configured to generate at least one comparison signal in response to the spare word line enabling signal and a memory cell block address of a first memory cell block among the at least one pair of memory cell blocks;
   a data exchange control signal generator configured to generate a data exchange control signal in response to the at least one comparison signal; and
   a data exchange unit configured to selectively exchange a data line with an inverted data line to respectively couple the data line and the inverted data line to inverted read data and read data in response to the data exchange control signal, the data line and the inverted data line coupled to a second memory cell block adjacent to the first memory cell block.

2. The memory device of claim 1, further comprising a main amplifier configured to amplify a voltage difference or a current difference between the read data and the inverted read data in response to a read command control signal to output the amplified data to an external pin.

3. The memory device of claim 2, wherein the data exchange unit includes a plurality of transistors that respectively couple the data line and the inverted data line to the read data and the inverted read data or respectively couple the data line and the inverted data line to the inverted read data and the read data in response to a logic state of the data exchange control signal.

4. The memory device of claim 1, wherein the data exchange control signal generator comprises:
   a pre-charge unit configured to precharge the data exchange control signal to a logic-low level in response to an active signal;
   a latch, coupled to the pre-charge unit, configured to maintain a level of the data exchange control signal; and
   a discharge unit configured to enable the data exchange control signal, wherein an enabled data exchange control signal has a logic-high level in response to the at least one comparison signal.

5. The memory device of claim 1, wherein the row decoder comprises:
   a defective address storing unit configured to store a defective address and to generate the spare word line enabling signal when an address received from an external source includes the defective address; and
   a logic circuit configured to generate the at least one comparison signal by performing a logical AND operation on the spare word line enabling signal and an adjacent memory cell block address.

6. A memory device comprising:
   at least one pair of memory cell blocks adjacent to each other having an open bit line cell architecture, and having a first cell array and a second cell array;
   a row decoder configured to generate a spare word line enabling signal in response to a defective row address, and configured to generate at least one comparison signal in response to the spare word line enabling signal and a memory cell block address of a first memory cell block among the at least one pair of memory cell blocks;
   a data exchange control signal generator configured to generate a data exchange control signal in response to at least one comparison signal;
   a write driver configured to output write data and inverted write data; and
   a data exchange unit configured to selectively exchange the write data with the inverted write data to respectively couple the write data and the inverted write data to a data line and an inverted data line in response to the data exchange control signal, the data line and the inverted data line coupled to a second memory cell block adjacent to the first memory cell block.

7. The memory device of claim 6, wherein the data exchange unit includes a plurality of transistors that respectively couple the data line and the inverted data line to the write data and the inverted write data or respectively couple the data line and the inverted data line to the inverted write data and the write data in response to a logic state of the data exchange control signal.

8. The memory device of claim 6, wherein the data exchange control signal generator comprises:
   a pre-charge unit configured to precharge the data exchange control signal to a logic-low level in response to an active signal;
   a latch, coupled to the pre-charge unit, configured to maintain a level of the data exchange control signal; and
   a discharge unit configured to enable the data exchange control, wherein an enabled data exchange control signal has a logic-high level in response to the at least one comparison signal.

9. The memory device of claim 6, wherein the row decoder comprises:

a defective address storing unit configured to store a defective address and to generate the spare word line enabling signal when an address received from an external source includes the defective address; and a logic circuit configured to generate the at least one comparison signal by performing a logical AND operation on the spare word line enabling signal and an adjacent memory cell block address.

10. A method of performing a read operation in a memory device, the memory device including open bit line cells and having a first memory cell block and a second memory cell block adjacent to the first memory cell block, comprising:

generating a spare word line enabling signal of the first memory cell block in response to at least one defective address of the second memory cell block;

generating a data exchange control signal in response to the spare word line enabling signal and a memory cell block address signal of the second memory cell block;

exchanging, selectively, first data of a data line with second data of an inverted data line in response to the data exchange control signal, the data line and the inverted data line coupled with the first memory cell block; and outputting the first data and the second data to an external pin.

11. The method of claim 10, wherein the exchanging couples the data line and the inverted data line to a read data and an inverted read data of an amplifier, respectively, or couples the data line and the inverted data line to the inverted read data and the read data of the amplifier, respectively.

12. A method of performing a write operation in a memory device, the memory device including open bit line cells, and having a first memory cell block and a second memory cell block adjacent to the first memory cell block, comprising:

generating a spare word line enabling signal of the first memory cell block in response to at least one defective address of the second memory cell block;

generating a data exchange control signal in response to the spare word line enabling signal and a memory cell block address signal of the second memory cell block;

outputting write data and inverted write data in response to a write control signal in a write driver; and exchanging, selectively, the write data and the inverted write data to an inverted data line and a data line in response to the data exchange control signal, the data line and the inverted data line coupled with the first memory cell block.

13. The method of claim 12, wherein the exchanging respectively couples the data line and the inverted data line to the write data and the inverted write data of the write driver, or respectively couples the data line and the inverted data line to the inverted write data and the write data of the write driver in response to a logic-state of the data exchange control signal.

* * * * *